(12) United States Patent
Tong-Viet

(10) Patent No.: US 9,007,763 B2
(45) Date of Patent: Apr. 14, 2015

(54) AIRFLOW CONTROL APPARATUS

(75) Inventor: Emmanuel Tong-Viet, Montpellier (FR)

(73) Assignee: International Business Machines Corporation, Armonk, NY (US)

( * ) Notice: Subject to any disclaimer, the term of this patent is extended or adjusted under 35 U.S.C. 154(b) by 785 days.

(21) Appl. No.: 13/047,961

(22) Filed: Mar. 15, 2011

(65) Prior Publication Data

US 2011/0292603 A1    Dec. 1, 2011

(30) Foreign Application Priority Data

Jun. 1, 2010  (EP) ...................................... 10305576

(51) Int. Cl.
 *H05K 7/20* (2006.01)
(52) U.S. Cl.
 CPC .................................. *H05K 7/20736* (2013.01)
(58) Field of Classification Search
 CPC .................. H01L 23/467; H01L 2224/48091; H01L 2924/19041; H01L 2924/01079; F24F 7/04; F24F 7/06; G06F 1/20; G06F 1/203; G06F 1/181; H05K 7/20145; H05K 7/20172; H05K 7/20572
 USPC ........................ 361/675–678, 679.46–679.54, 361/688–723, 752, 831
 See application file for complete search history.

(56) References Cited

U.S. PATENT DOCUMENTS

| | | | | |
|---|---|---|---|---|
| 4,399,485 A | * | 8/1983 | Wright et al. .................. | 361/693 |
| 4,644,443 A | * | 2/1987 | Swensen et al. .......... | 361/679.49 |
| 6,100,659 A | * | 8/2000 | Will et al. ...................... | 318/466 |
| 6,201,364 B1 | * | 3/2001 | Will et al. ...................... | 318/466 |
| 6,453,972 B1 | * | 9/2002 | Sher et al. ...................... | 160/133 |
| 6,506,111 B2 | * | 1/2003 | Sharp et al. .................... | 454/184 |
| 6,672,955 B2 | * | 1/2004 | Charron ......................... | 454/184 |
| 6,924,615 B2 | * | 8/2005 | Cavarec et al. ................ | 318/466 |
| 6,991,693 B2 | * | 1/2006 | Wylie et al. ................... | 156/160 |
| 7,028,742 B2 | * | 4/2006 | Sears et al. .................... | 160/310 |
| 7,182,208 B2 | * | 2/2007 | Tachibana ........................ | 211/26 |
| 7,259,485 B2 | * | 8/2007 | Cavarec et al. .................. | 310/77 |
| 7,259,963 B2 | * | 8/2007 | Germagian et al. .......... | 361/695 |
| 7,542,289 B2 | * | 6/2009 | Tsai et al. ...................... | 361/695 |
| 8,009,430 B2 | * | 8/2011 | Claassen et al. ............... | 361/724 |
| 8,037,644 B2 | * | 10/2011 | Hall ................................. | 52/69 |
| 8,526,181 B2 | * | 9/2013 | Levesque et al. ............. | 361/690 |
| 2001/0011579 A1 | * | 8/2001 | Davies et al. ................. | 160/23.1 |
| 2001/0027621 A1 | * | 10/2001 | Davies et al. ................... | 49/360 |
| 2002/0149911 A1 | * | 10/2002 | Bishop et al. ................. | 361/690 |
| 2003/0050003 A1 | * | 3/2003 | Charron ......................... | 454/184 |
| 2004/0023614 A1 | * | 2/2004 | Koplin .......................... | 454/184 |
| 2004/0218355 A1 | * | 11/2004 | Bash et al. ..................... | 361/690 |
| 2004/0227435 A1 | * | 11/2004 | Rasmussen ................... | 312/236 |

(Continued)

*Primary Examiner* — Courtney Smith
(74) *Attorney, Agent, or Firm* — Douglas A. Lashmit; Hoffman Warnick LLC

(57) ABSTRACT

An adjustable blocking arrangement for electronic hardware or computer racks, for preventing the undesired leakage of air through rack spaces not filled with hardware. An airflow control device is provided comprising a flexible web and a magazine adapted to receive the part of the flexible web that is not deployed. The device is adapted such that a length of the web may be deployed to sealingly block a space in the rack that is not filled with hardware modules, to prevent the flow of air through the space. The device may comprising a detection system adapted to detect the space in the rack that is not filled with hardware modules, and a processing system adapted to receive a signal from the detection system, and as a function of the signal to automatically deploy or retract the flexible web so as to sealingly block the space.

16 Claims, 8 Drawing Sheets

(56) References Cited

U.S. PATENT DOCUMENTS

| | | |
|---|---|---|
| 2004/0232098 A1 | 11/2004 | Orr |
| 2004/0257766 A1* | 12/2004 | Rasmussen et al. .......... 361/689 |
| 2005/0003753 A1* | 1/2005 | Sample et al. ................ 454/184 |
| 2005/0211389 A1* | 9/2005 | Snyder et al. ................ 160/23.1 |
| 2005/0237716 A1* | 10/2005 | Chu et al. ..................... 361/696 |
| 2006/0260338 A1* | 11/2006 | VanGilder et al. ........... 62/259.2 |
| 2006/0276121 A1* | 12/2006 | Rasmussen .................. 454/184 |
| 2006/0283111 A1* | 12/2006 | Ayers et al. ..................... 52/239 |
| 2007/0129000 A1* | 6/2007 | Rasmussen et al. .......... 454/184 |
| 2008/0265722 A1 | 10/2008 | Saliaris |
| 2009/0059486 A1 | 3/2009 | Taylor |
| 2009/0059519 A1* | 3/2009 | Ong et al. ..................... 361/690 |
| 2009/0061755 A1* | 3/2009 | Calder et al. ................. 454/184 |
| 2009/0122484 A1* | 5/2009 | Caveney ....................... 361/692 |
| 2009/0139668 A1* | 6/2009 | Naylor .......................... 160/310 |
| 2009/0178991 A1 | 7/2009 | Rasmussen et al. |
| 2009/0310264 A1* | 12/2009 | Cooper et al. ................... 361/23 |
| 2010/0024992 A1* | 2/2010 | Cloninger et al. ............ 160/311 |
| 2010/0061057 A1* | 3/2010 | Dersch et al. ................ 361/690 |
| 2010/0105313 A1* | 4/2010 | Tsai et al. ..................... 454/284 |
| 2010/0108272 A1* | 5/2010 | Karidis ......................... 160/238 |
| 2010/0165568 A1* | 7/2010 | Tsai et al. ................. 361/679.49 |
| 2010/0230058 A1* | 9/2010 | Mahoney ...................... 160/331 |
| 2010/0243175 A1* | 9/2010 | Gonzales et al. ................. 160/7 |
| 2011/0045759 A1* | 2/2011 | Rasmussen et al. .......... 454/184 |
| 2013/0163191 A1* | 6/2013 | Chen et al. ............... 361/679.46 |

* cited by examiner

AIRFLOW CONTROL APPARATUS

TECHNICAL FIELD

The present invention relates to housings for electronic hardware, and in particular to the control of airflow in rack type housings.

RELATED ART

The effective cooling of electronic hardware is an increasingly important issue, particularly in the field of datacenters in which a large amount of such hardware is generally grouped together, such that the energy cost of cooling becomes a significant factor, and raises substantial technical problems. Numerous pieces of electrical hardware such as blade computers, network switches, etc., are commonly mounted in a single rack configuration. The dimensions of such hardware are generally chosen so as to fit standard racks in width and depth, and also height, by being an integer number of standard units in height, where a given rack can hold a certain number of such units. Conventionally, the hardware mounted in such racks will be designed to draw in air on one side, e.g., the front, and expel it on another side, e.g., the rear. In such environments it is increasingly common to arrange a number of such racks in rows, arranged so as to establish hot aisles into which the electronic hardware in adjacent rows expel air, and cool aisles from which electronic hardware in adjacent rows draw air. Such an approach leads to optimal thermodynamic efficiency, thereby reducing the overall cost of satisfactorily cooling the datacenter.

FIG. 1 shows a fully populated rack in a configuration as described above. As shown, a rack 100 incorporates electronic hardware 111 to 123 arranged in the rack 100 so as to expel air to the rear of the rack (the right as shown (A)), and to draw air from the front of the rack (the left as shown (B)). Cool air may arrive for example via perforated floor tiles, and be extracted through a false ceiling.

While FIG. 1 shows a rack 100 fully populated, that is with each of the unit spaces filled with electronic hardware, a problem arises when one or more units are not filled. This is a frequent occurrence, since it is often necessary to move hardware from one rack to another, to remove hardware for repair, to replace a larger hardware unit with a more recent hardware unit, which will tend to be smaller, and so on. Where a gap is thus created in a particular rack, this will permit air from the warm side of the rack to leak back to the cool side, thereby reducing the thermodynamic efficiency of the system.

FIG. 2 shows a partially populated rack in a configuration as described above. As shown, the rack 100 incorporates electronic hardware 111, 112, 114, 116, 118, 120, 121, 122 arranged in the rack 100 so as to expel air to the rear of the rack (the right as shown (A)), and to draw air from the front of the rack (the left as shown (B)). Since electronic hardware 113, 115, 117, 119 and 123 is now missing, warm air represented by the arrows 230 may leak back to the cool side. The leaked warm air will mix with the cool air before being drawn back into the electronic hardware, leading to less effective cooling, which will in turn translate into an increased hardware failure rate, or an elevated energy consumption.

FIG. 3 shows a partially populated rack in a configuration modified to address the airflow problem described with regard to FIG. 2. As shown, the gaps between electronic hardware 111, 112, 114, 116, 118, 120, 121, 122 are blocked with blocking plates 331, 332, 333, 334, 335, 336, 337, 338 arranged in the rack 100 so as to prevent the leakage of warm air back to the cool side. Such blocking plates are available in the standard unit sizes to which the electronic hardware complies.

SUMMARY OF THE INVENTION

The present invention provides an airflow control device and an electronic hardware rack.

An aspect of the present invention is directed to an airflow control device for an electronic hardware rack adapted to house a plurality of electronic hardware modules of a specified width, the device comprising: a flexible web of at least the specified width; and a magazine for receiving a part of the flexible web that is not deployed, wherein the airflow control device is configured such that a length of the flexible web may be deployed from the magazine to sealingly block a space in the rack that is not filled with hardware modules to prevent a flow of air through the space.

Another aspect of the present invention is directed to a system, comprising: an electronic hardware rack; a plurality of electronic hardware modules of a specified width housed in the rack; and an airflow control device for blocking a space in the rack that is not filled with the hardware modules to prevent a flow of air through the space, the airflow control device comprising: a flexible web of at least the specified width; and a magazine for receiving a part of the flexible web that is not deployed, wherein the airflow control device is configured such that a length of the flexible web may be deployed from the magazine to sealingly block the space in the rack that is not filled with hardware modules to prevent a flow of air through the space.

Further aspects, embodiments, and advantages of the present invention will become clear to the skilled person upon examination of the drawings and detailed description. It is intended that any additional aspects, embodiments, and advantages be incorporating therein.

BRIEF DESCRIPTION OF THE DRAWINGS

Embodiments of the present invention will now be described by way of example with reference to the accompanying drawings in which like references denote similar elements.

DETAILED DESCRIPTION OF THE INVENTION

As described hereafter the present invention provides a flexible arrangement for the filling of gaps in a rack as required.

Figure 1:
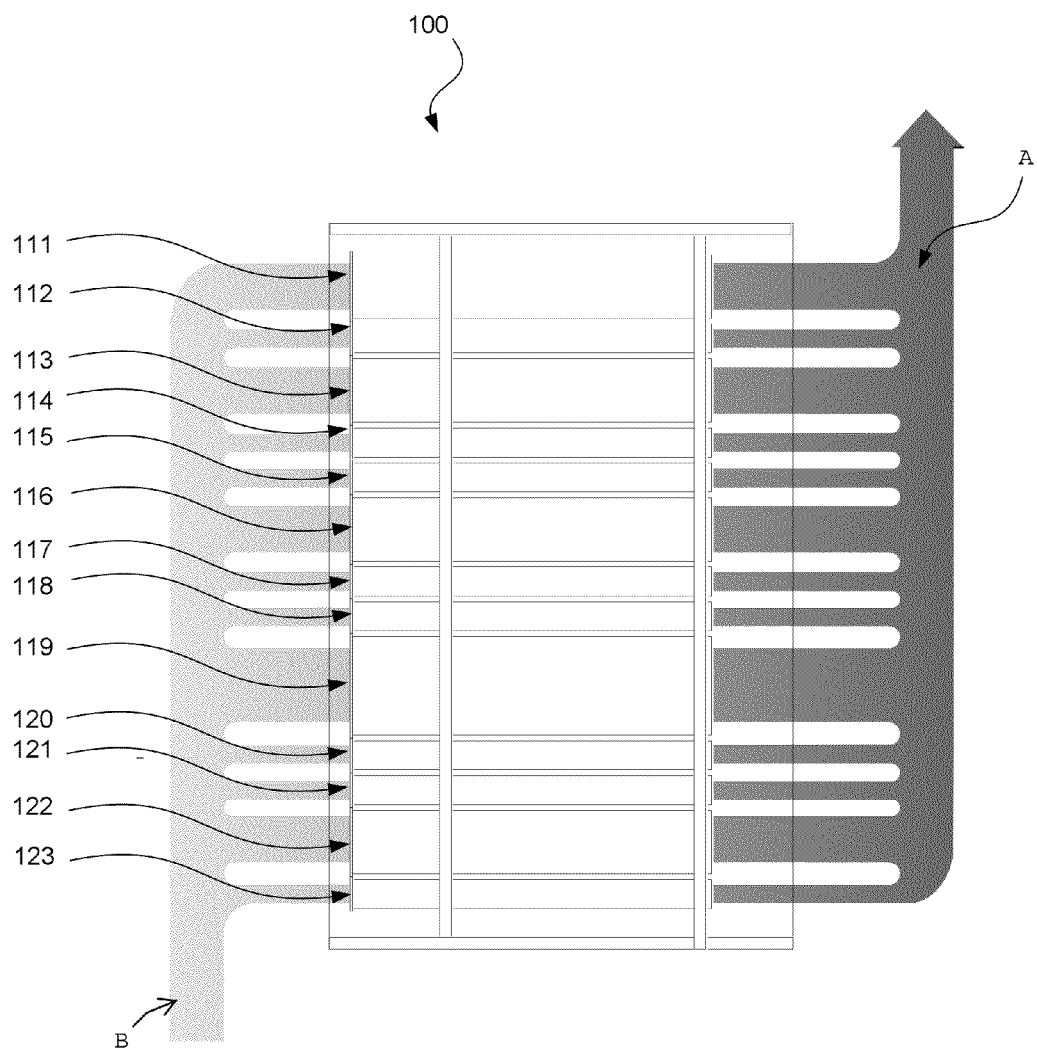
FIG. 1 shows a fully populated rack in accordance with the related art.
Figure 2:
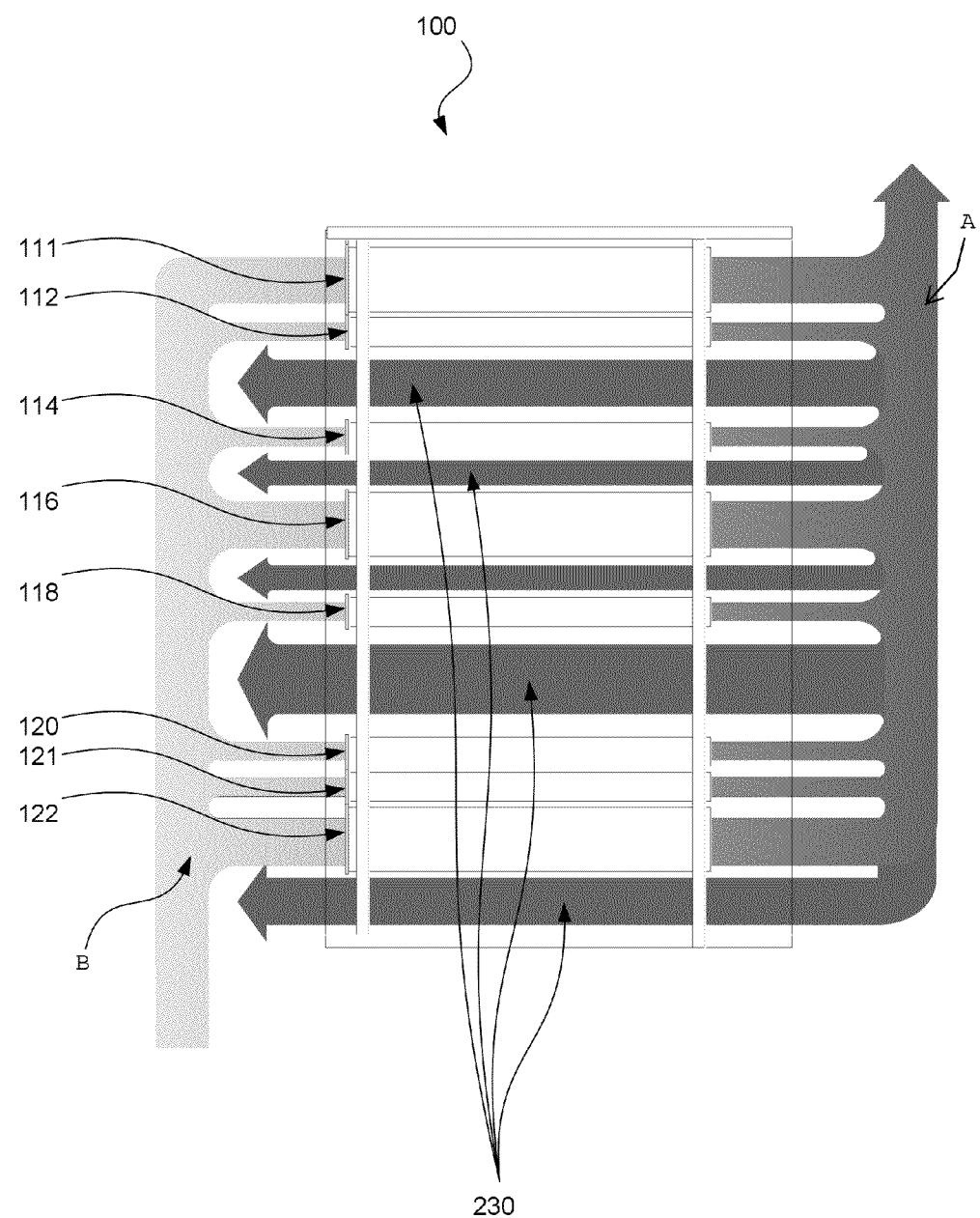
FIG. 2 shows a partially populated rack in a configuration in accordance with the related art.
Figure 3:
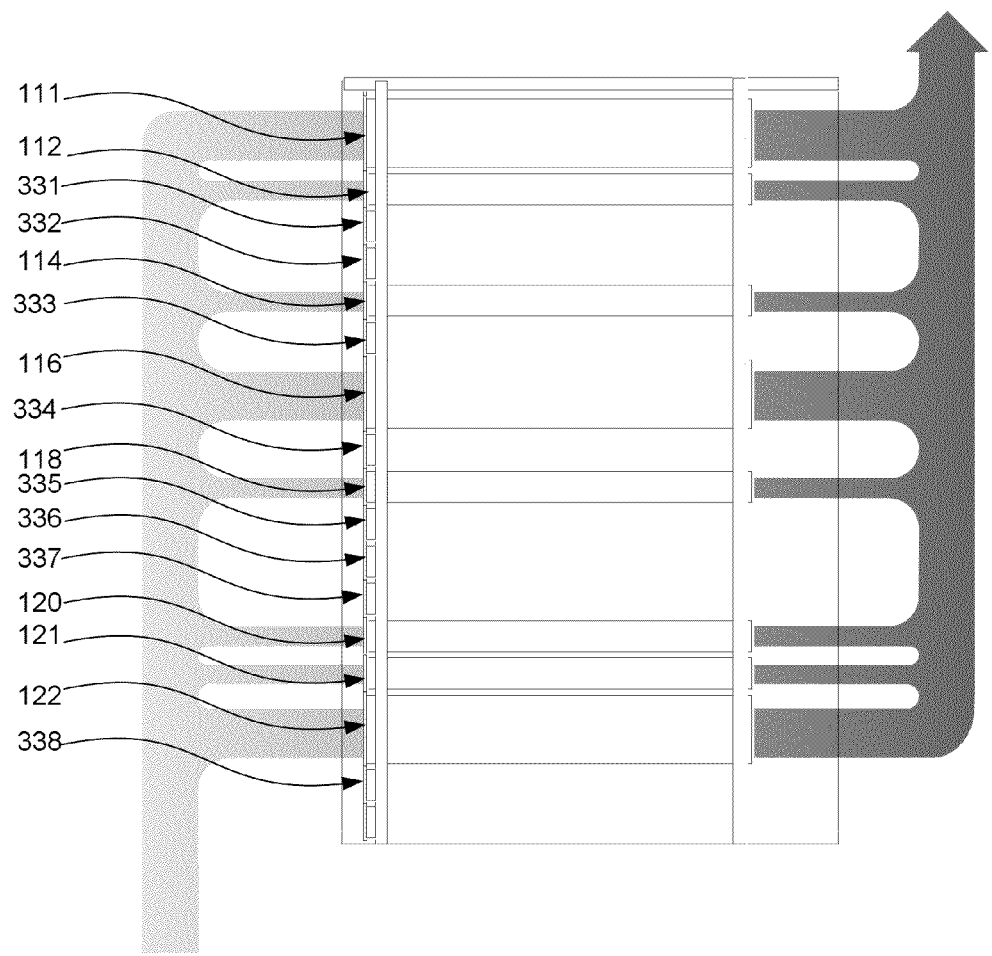
FIG. 3 shows a partially populated rack in a configuration modified to address the airflow problem described with regard to FIG. 2 in accordance with the related art.
Figure 4:
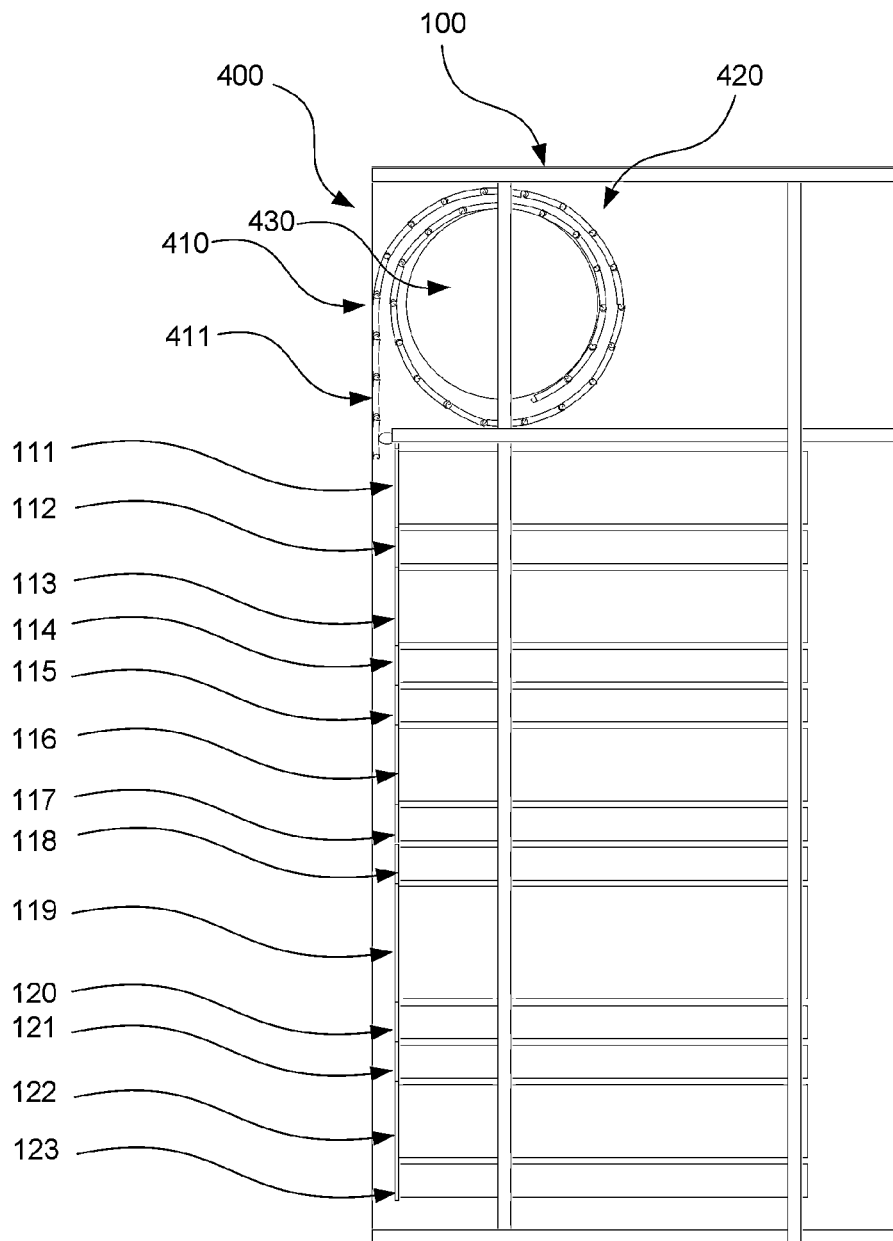
FIG. 4 shows a first embodiment in a first configuration, with a fully filled rack.

FIG. 4 shows a first embodiment in a first configuration, with a fully filled rack. As shown, there is accordingly provided an airflow control device 400 for an electronic hardware rack 100 adapted to house a plurality of electronic hardware modules 111 to 123 of a specified width. The airflow control device 400 comprises a flexible web 410 of at least the specified width and a magazine 420 adapted to receive the part of the flexible web 410 that is not deployed. As shown in FIG. 4 the whole flexible web 410 is stored in the magazine 420.

The specified width is conventionally 480 mm (19 inches) or 580 mm (23 inches), although many other widths are possible.

The height of each the hardware modules is conventionally a respective integer multiple of a standard unit height, and the rack 100 is dimensioned so as to house hardware whose total height is a further integer multiple of the standard unit height, and wherein the airflow control device 400 is adapted to deploy the flexible web 410 in lengths equal to the standard unit height. This standard unit height is conventionally 44.4 mm (1.75 inches), although many other unit heights are possible.

As shown in FIG. 4, the magazine 420 comprises a drum 430 rotatably mounted within the magazine 420 so as to deploy or retract a desired length of the web 410 by winding the web 410 thereabout. In an embodiment, the web 410 is composed of a plurality of articulated slats 411. The height of each articulated slat 411 may, for example, be equal to the standard unit height of the rack.

Figure 5:
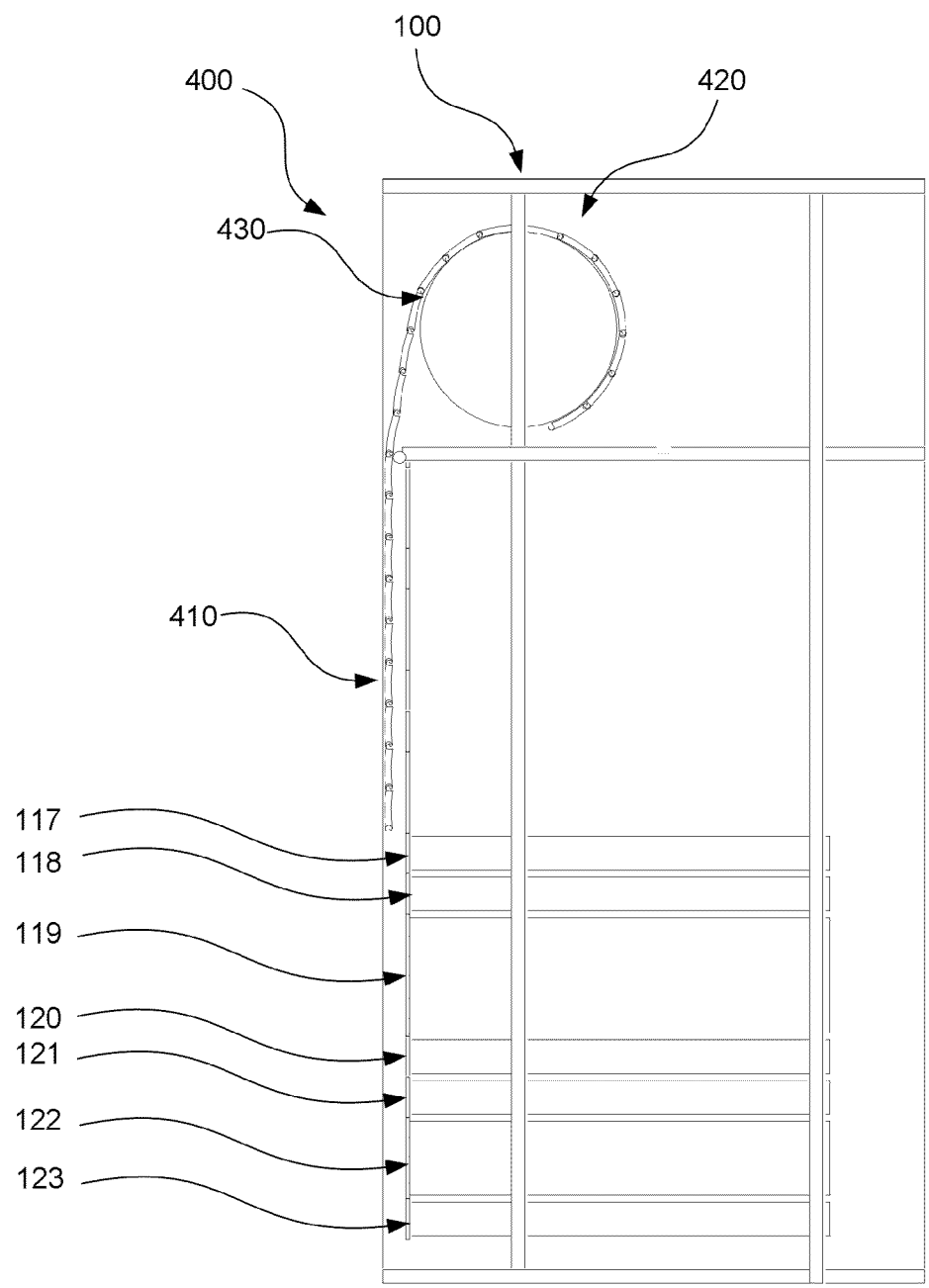
FIG. 5 shows a first embodiment in a second configuration, with a partially filled rack.

FIG. 5 shows a first embodiment in a second configuration, with a partially filled rack 100. As shown in FIG. 5, hardware elements 111 to 116 have been removed, leaving only units 117 to 123. A length of the flexible web 410 has been wound out from the magazine 420 so as to hang down the front of the rack 100, as far as the top of the first remaining unit 117. The deployed length of web 410 thus blocks the space left by the removal of units 111 to 116. Accordingly, the device is adapted such that a length of the web 410 may be deployed so as to sealingly block a space in the rack 100 that is not filled with hardware modules, so as to prevent the flow of air through the space.

The degree of sealing required will depend on the circumstances. In some cases, it may be sufficient for the deployed web 410 to simply hang against the edges of the rack 100 along side the empty slots, and the top edge of the first hardware unit 117, as shown in FIG. 5. In other cases, it may be desirable to improve the sealing, for example, by providing the web 410 or the corresponding parts of the rack 100 or equipment units with a compliant material able to deform under the hanging weight of the web 410 so as to form a tight seal. Still further, the rack 100 and or web 410 may be fitted with a coupling system for positively coupling the web to the edges to be sealed. This may be achieved using, for example, magnetic strips or a hook and loop type fabric. Mechanical catches or other securing components configured to hold the deployed web 410 in a particular position with respect to the rack 100 and the topmost equipment unit may also be used. Furthermore, the rack 100 may comprise side channels adapted to receive the edges of the web 410, such that regardless of the degree of extension of the web 410, the web 410 is always sealingly engaged to the sides.

Figure 6:
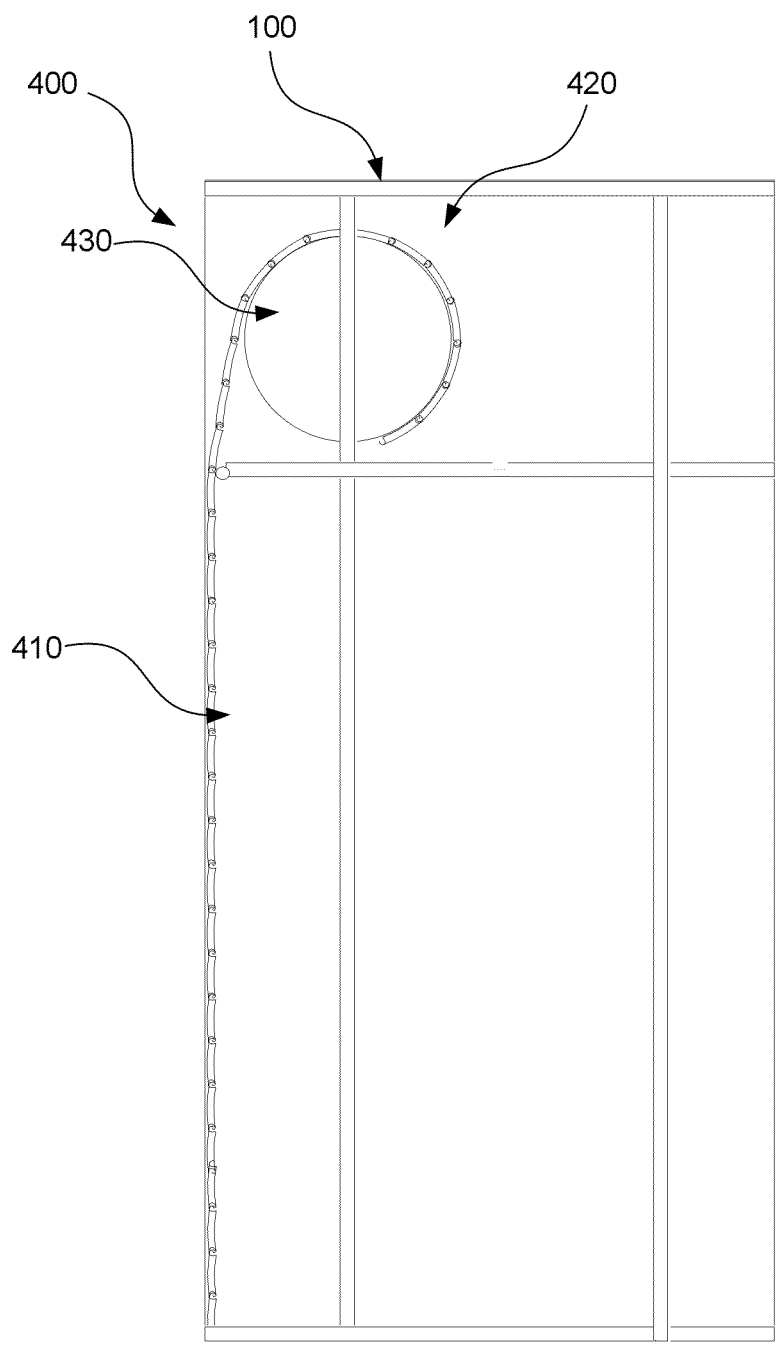
FIG. 6 shows a first embodiment in a third configuration, with an empty rack.

FIG. 6 shows a first embodiment in a third configuration, with an empty rack 100. As shown in FIG. 6, hardware elements 123 to 116 have been removed, leaving the rack 100 entirely empty. The majority of the flexible web 410 has been wound out of the magazine 420 so as to hang down the front of the rack 100, down to the bottom of the rack 100. The deployed length of web 410 thus blocks the space left by the removal of units 111 to 123. Accordingly, the device is adapted such that a length of the web 410 may be deployed so as to sealingly block a space in the rack 100 that is not filled with hardware modules, so as to prevent the flow of air through the space.

Although described above in terms of components integrated in a specially adapted rack, one may equally envisage a removable casing compliant with the standard rack unit dimensions so as to be retrofitable in any correspondingly dimensioned rack. As well as meaning that the advantages of the present invention may be obtained without replacing existing racks, this approach also means that it is no longer necessary for all elements of computer hardware to be moved to the bottom of a rack, since it is possible to add a retrofitable case such as that shown in FIG. 7 in a gap below existing computer hardware. In other words, the external height thereof is an integer multiple of the standard unit height, and the magazine is adapted to fit into the rack in the manner of the electronic hardware modules.

Figure 7:
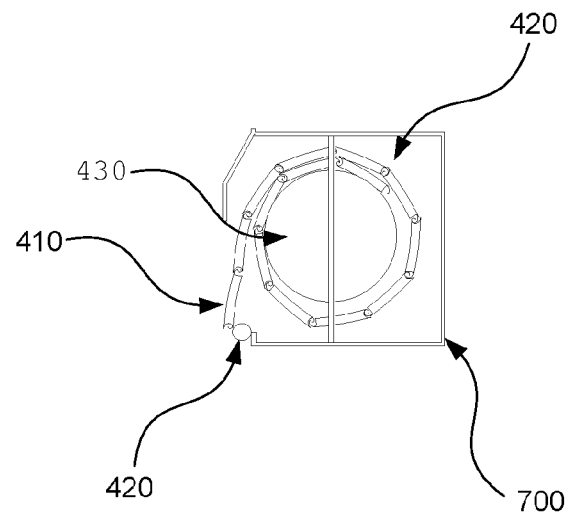
FIG. 7 shows a retrofitable casing for the drum type structure of the first embodiment.

FIG. 7 shows a retrofitable casing for the drum type structure of the first embodiment. As shown, there is provided a rack mountable case 700 which is an integer number of standard units in height. Depending on the length of the web 410 to be stored therein, the height of the case may be a plurality of units in height.

Figure 8:
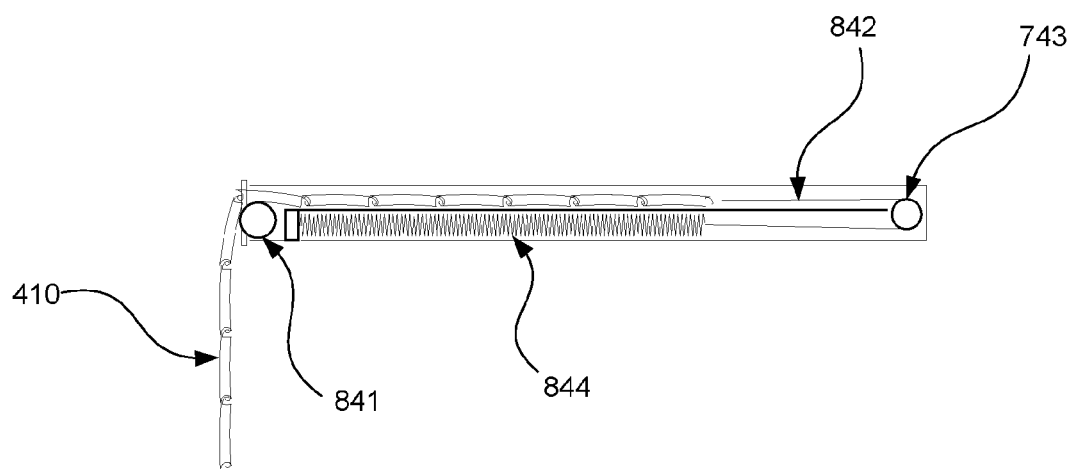
FIG. 8 shows a second embodiment.

FIG. 8 shows a second embodiment. As shown in FIG. 8, rather than the web 410 being wound onto a drum mounted within the magazine, the magazine 800 comprises a planar tray disposed at right angles to the plane in which the web 410 is deployed, i.e., in a conventional rack configuration, in a horizontal plane. The magazine comprises a rack mountable case one standard unit in height, with the retracted web 410 lying flat within it. There is further provided an outlet roller 841 to assist a smooth deployment of the web 410 as required. As shown there is further provided a tensioning system 844, which may for example comprise a spring or elastic member, which is coupled to the extremity of the web 410 by a cable 842. In order to efficiently use the available volume, the tensioning system 844 is disposed below the space reserved for the retracted web 410, with the cable 842 passing around a roller 743 to the reverse the direction of tension provided. Additionally or alternatively there may be provided a damping system, such that the web 410 will remain at whatever stage of deployment it is set to without the need for further fixing. Alternatively, there may be provided a ratchet system, for example in the roller 743, so that the web 410 may be deployed in sections of a predetermined length corresponding, for example, to a standard unit height.

An advantage of this approach as compared to the drum approach described with respect to the first embodiment is that less vertical rack space is used for the storage of the web, so that more space is available for the storage of electronic hardware. On the other hand, the total length of the web is to some extent limited by the depth of the casing, whereas the drum approach may permit the provision of a longer web.

While the embodiment of FIG. 8 is described in the context of a removable casing compliant with the standard rack unit dimensions so as to be retrofitable in any correspondingly dimensioned conventional rack, one may equally envisage a rack itself incorporating as structure as described herein.

In a case where it is desired to introduce a degree of automation, the cable 842 may simply be fixed to the roller 743, and an electric motor provided to actuate the roller 743 so as to deploy of retract the desired length of web 410.

Whilst throughout the foregoing the web has been described in terms of a plurality of articulated slats, it will be appreciate that the same effect may be achieved in other ways.

For example, in one alternative the web may be a continuous strip of flexible material such as a fabric, or a flexible plastic material, etc. The material may advantageously be transparent, so as to permit monitoring of the electrical hardware. The web may also advantageously provide heat insulation, be heat reflective, or waterproof.

The device of any preceding embodiment may further comprise an actuation system adapted to automatically deploy or retract the flexible web by a desired amount.

Any embodiment may advantageously be adapted to collaborate with a detection system adapted to detect the space in the rack that is not filled with hardware modules. Such a detection system may form part of the device itself, or be integrated in a conventional rack in which the device is retrofitted as described above. The detection system may comprise, for example, mechanical or optical switches integrated in the rack frame and actuated by the insertion or removal of a piece of electrical hardware. The detector may comprise a sensor embedded in the web itself, for example at the leading edge thereof. Such a sensor may comprise a mechanical, optical, or sonic sensor able to detect the presence of an object in the vicinity thereof, whereby the web may be deployed until the detector at its leading edge detects an object. Still further, the detector may comprise an optical of sonic sensor mounted at the top of the rack and pointing downwards so as to detect the distance to the first piece of electronic hardware. These last two approaches are particularly advantageous in that they permit the device to automatically deploy the web to the requisite position whilst being entirely self contained within the device in its retrofitable form, and independent of any sensors in the rack.

Figure 9:
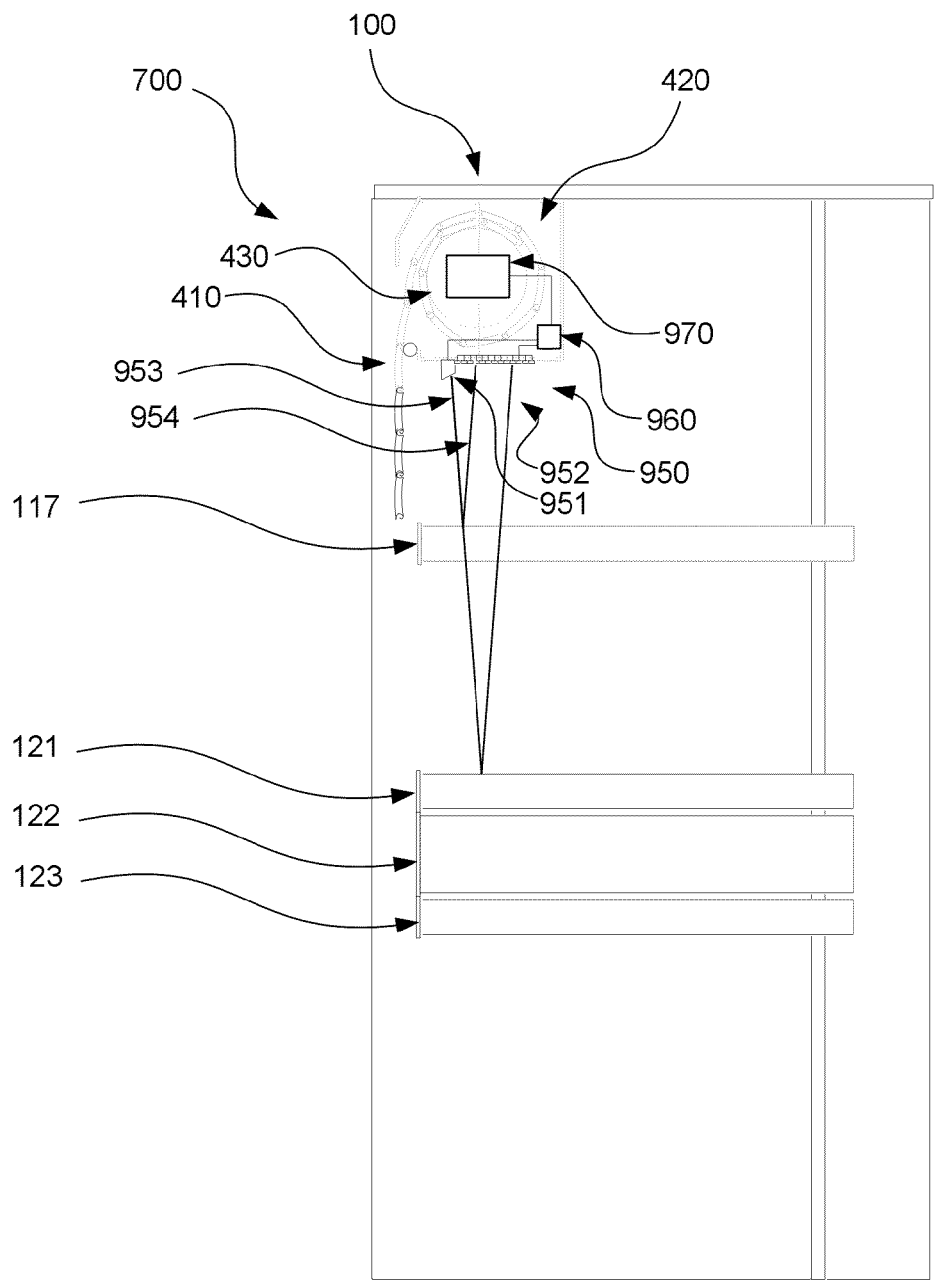
FIG. 9 shows the device of FIG. 7 adapted to incorporated detection means.

FIG. 9 shows the device of FIG. 7 including a detection system. A retrofitable device 700 comprises a detection system 950 adapted to detect a space in the rack 100 that is not filled with hardware modules. As shown, the detection system 950 comprises an optical transmitter such as a laser diode 951, and an array of detectors 952. The optical transmitter 951 emits a light beam 953, and the light reflected by the first piece of electronic hardware encountered will be reflected to the array of detectors 952 and, depending on the distance to the first piece of electronic hardware, will strike a different element in the array 952, thereby indicating the number of units that are not filled. This information is relayed to a processing system 960 (e.g., a microprocessor, computer system, etc.), which in turn actuates the drum 430 by controlling a stepper motor 970 so as to deploy or retract the web 410 to the desired position to sealingly block the detected space. As shown, the electronic hardware 117, situated in the fourth slot from the top is the first piece of electronic hardware encountered.

In accordance with a still further embodiment, a device as described herein may be coupled to one or more sensors, for example a fire detection system, and controlled such that in the event of a fire, flooding or other potentially harmful ambient condition, the web is automatically deployed to it's fullest extent so as to protect the underlying electrical hardware.

The term sealingly as used herein is to be interpreted as substantially impeding airflow though the junction in question. Preferably, the air escaping through a meter length of sealed junction in one hour should not exceed 4 m3/(m·hr), with a pressure differential across the junction of 50 Pa. More preferably, the air loss should not exceed 2 m3/(m·hr). Still more preferably, the air loss should not exceed 1 m3/(m·hr). Still more preferably, the air loss should not exceed 0.1 m3/(m·hr). The web as described above may sealingly engage the rack at its edges, and/or may also sealingly engage the edge of one or more pieces of hardware mounted in the rack, for example at the end of the web.

Whilst the preceding embodiments describe arrangements in which the web is suspended downward from its casing, it is also envisaged that the web may extend upward. In such cases it may be necessary to provide further means to ensure that the web remains in the desired plane, for example by recourse to magnetic strips or a hook and loop type fabric. A mechanical system may also be employed, for example by providing mechanical catches or other securing system capable of holding the deployed web in a particular position with respect to the rack and the topmost equipment unit. Furthermore, the rack may comprise side channels adapted to receive the edges of the web. Still further, there may be provided a tensioning system supporting the upper edge of the web.

According to a further embodiment there is provided an adjustable blocking arrangement for electronic hardware or computer racks, for preventing the undesired leakage of air through rack spaces not filled with hardware. An airflow control device is provided comprising a flexible web, which may be a continuous sheet or set of articulated slats, and a magazine adapted to receive the part of the flexible web that is not deployed. The device is adapted such that a length of the web may be deployed so as to sealingly block a space in the rack that is not filled with hardware modules, so as to prevent the flow of air through the space. The device may comprising a detection system adapted to detect the space in the rack that is not filled with hardware modules, and further comprising a processing system adapted to receive a signal from the detection system, and as a function of the signal to automatically deploy or retract the flexible web so as to sealingly block the space.

It will be clear to one skilled in the art that many improvements and modifications can be made to the foregoing exemplary embodiments without departing from the scope of the present invention.

The invention claimed is:

1. An airflow control device for an electronic hardware rack for housing a plurality of electronic hardware modules of a specified width, the airflow control device preventing air from a rear of the rack from flowing into cooling air at a front of the rack, the device comprising:
   a flexible web of at least the specified width, the flexible web comprising a plurality of equally sized articulated slats;
   a magazine for receiving a part of the flexible web that is not deployed, wherein a length of the flexible web may be deployed by the airflow control device from the magazine to sealingly block a space in the rack that is not filled with hardware modules to prevent a flow of the air from the rear of the rack through the space into the cooling air at the front of the rack;
   a detection system for detecting the space in the rack that is not filled with hardware modules; and
   a processing system for receiving a signal from the detection system and, as a function of the signal, to automatically deploy the flexible web when the space in the rack is not filled with hardware modules.

2. The airflow control device of claim 1, wherein a height of each hardware module is a respective integer multiple of a standard unit height, wherein the rack is dimensioned to house a plurality of hardware modules having a total height equal to a further integer multiple of the standard unit height, and wherein the airflow control device deploys the flexible web in lengths equal to the standard unit height.

3. The airflow control device of claim 2, wherein each of the articulated slats has a height equal to the standard unit height.

4. The airflow control device of claim 1, wherein the magazine comprises a drum rotatably mounted within the magazine to deploy or recover a desired length of the flexible web by winding the flexible web from or onto the drum.

5. The airflow control device of claim 1, wherein the magazine comprises a planar tray disposed at right angles to a plane in which the flexible web is deployed.

6. The airflow control device of claim 1, wherein an external height of the airflow control device is an integer multiple of the standard unit height, and wherein the magazine fits into the rack in a same manner as the electronic hardware modules.

7. The airflow control device of claim 1, further comprising an actuation system for automatically deploying or retracting the flexible web by a desired amount.

8. A system, comprising:
an electronic hardware rack;
a plurality of electronic hardware modules of a specified width housed in the rack; and
an airflow control device for blocking a space in the rack that is not filled with the hardware modules to prevent a flow of air from a rear of the rack through the space into cooling air at a front of the rack, the airflow control device comprising:
a flexible web of at least the specified width, the flexible web comprising a plurality of equally sized articulated slats;
a magazine for receiving a part of the flexible web that is not deployed, wherein a length of the flexible web may be deployed by the airflow control device from the magazine to sealingly block the space in the rack that is not filled with hardware modules to prevent a flow of the air from the rear of the rack through the space into the cooling air at the front of the rack;
a detection system for detecting the space in the rack that is not filled with hardware modules; and
a processing system for receiving a signal from the detection system and, as a function of the signal, to automatically deploy the flexible web when the space in the rack is not filled with hardware modules.

9. The system of claim 8, further comprising a detection system for detecting the space in the rack that is not filled with hardware modules.

10. The system of claim 9, further comprising a communication system for conveying a signal from the detection system to a processing system, wherein, as a function of the signal, the flexible web is automatically deployed or retracted.

11. The system of claim 8, wherein a height of each hardware module is a respective integer multiple of a standard unit height, wherein the rack is dimensioned to house a plurality of hardware modules having a total height equal to a further integer multiple of the standard unit height, and wherein the airflow control device deploys the flexible web in lengths equal to the standard unit height.

12. The system of claim 11, wherein each of the articulated slats has a height equal to the standard unit height.

13. The system of claim 8, wherein the magazine comprises a drum rotatably mounted within the magazine to deploy or recover a desired length of the flexible web by winding the flexible web from or onto the drum.

14. The system of claim 8, wherein the magazine comprises a planar tray disposed at right angles to a plane in which the flexible web is deployed.

15. The system of claim 8, wherein an external height of the airflow control device is an integer multiple of the standard unit height, and wherein the magazine fits into the rack in a same manner as the electronic hardware modules.

16. The system of claim 8, further comprising an actuation system for automatically deploying or retracting the flexible web by a desired amount.

* * * * *